(12) United States Patent
Nomaguchi et al.

(10) Patent No.: US 8,581,219 B2
(45) Date of Patent: Nov. 12, 2013

(54) COMPOSITE CHARGED-PARTICLE-BEAM APPARATUS

(75) Inventors: Tsunenori Nomaguchi, Hitachinaka (JP); Toshihide Agemura, Tsuchiura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/576,072

(22) PCT Filed: Mar. 25, 2011

(86) PCT No.: PCT/JP2011/057273
§ 371 (c)(1),
(2), (4) Date: Jul. 30, 2012

(87) PCT Pub. No.: WO2011/118744
PCT Pub. Date: Sep. 29, 2011

(65) Prior Publication Data
US 2013/0001420 A1    Jan. 3, 2013

(30) Foreign Application Priority Data
Mar. 26, 2010 (JP) .................................. 2010-072604

(51) Int. Cl.
*H01J 37/30* (2006.01)
*H01J 37/28* (2006.01)

(52) U.S. Cl.
CPC .............. *H01J 37/3005* (2013.01); *H01J 37/28* (2013.01)
USPC ....................... 250/492.3; 250/399; 250/494.1

(58) Field of Classification Search
CPC .................................................... H01J 37/3005
USPC ................................ 250/492.3, 307, 309, 310
See application file for complete search history.

(56) References Cited

U.S. PATENT DOCUMENTS

| | | | |
|---|---|---|---|
| 4,976,843 A * | 12/1990 | Ward et al. ............... | 204/298.36 |
| 6,593,583 B2 * | 7/2003 | Iwasaki ...................... | 250/492.1 |
| 7,417,235 B2 * | 8/2008 | Schon et al. .................. | 250/397 |

(Continued)

FOREIGN PATENT DOCUMENTS

| | | |
|---|---|---|
| JP | 5-109379 A | 4/1993 |
| JP | 7-296756 A | 11/1995 |

(Continued)

OTHER PUBLICATIONS

Corresponding International Search Report with English Translation dated Mar. 31, 2011 (five (5) pages).

(Continued)

*Primary Examiner* — Robert Kim
*Assistant Examiner* — James Choi
(74) *Attorney, Agent, or Firm* — Crowell & Moring LLP

(57) ABSTRACT

There is provided a technology which allows SEM observation in real time without deteriorating the processing efficiency in FIB processing. In the present invention, a composite charged-particle-beam apparatus having a FIB column and a SEM column includes an SE3 detector which detects secondary electrons (referred to as tertiary electrons in this specification) discharged when back-scattered electrons generated by irradiating a sample with an electron beam collide with structures in a sample chamber. With use of the tertiary electrons, a SEM image is generated, and based on the SEM image, an ion beam processing state can be observed.

6 Claims, 7 Drawing Sheets

(56) References Cited

U.S. PATENT DOCUMENTS

| | | | |
|---|---|---|---|
| 2002/0066863 A1* | 6/2002 | Chao et al. | 250/397 |
| 2004/0158409 A1* | 8/2004 | Teshima et al. | 702/22 |
| 2008/0023641 A1* | 1/2008 | Takeuchi et al. | 250/396 ML |
| 2008/0283746 A1* | 11/2008 | Ohnishi | 250/307 |
| 2009/0020698 A1* | 1/2009 | Muto et al. | 250/310 |
| 2009/0134327 A1* | 5/2009 | Ikku et al. | 250/307 |
| 2010/0243888 A1* | 9/2010 | Nishiyama et al. | 250/307 |
| 2010/0294931 A1* | 11/2010 | Zarchin et al. | 250/310 |
| 2010/0301211 A1* | 12/2010 | Miller | 250/307 |
| 2011/0248164 A1* | 10/2011 | Straw et al. | 250/307 |

FOREIGN PATENT DOCUMENTS

| | | |
|---|---|---|
| JP | 07296756 A * | 11/1995 |
| JP | 9-161712 A | 6/1997 |
| JP | 2008-34172 A | 2/2008 |
| JP | 2008-286652 A | 11/2008 |
| JP | 2009-26621 A | 2/2009 |
| JP | 2009-536776 A | 10/2009 |
| WO | WO 2006/120005 A1 | 11/2006 |

OTHER PUBLICATIONS

Form PCT/ISA/237 (four (4) pages), Mar. 31, 2011.

* cited by examiner

COMPOSITE CHARGED-PARTICLE-BEAM APPARATUS

TECHNICAL FIELD

The present invention relates to a composite charged-particle-beam apparatus, and more specifically relates to a technology for observing a sample which is processed by an ion beam with use of an electron beam.

BACKGROUND ART

In recent years, Focused Ion Beam (FIB) apparatuses are used for producing thin film samples for (Scanning) Transmission Electron Microscopes ((S)TEMs). When thin film samples are produced for failure analysis of semiconductor devices in particular, it is desired in most cases to stop FIB processing in a specific cross section. Accordingly, it is general to use FIB-SEM apparatuses which allow observation of a FIB-processed cross section with use of a Scanning Electron Microscope (SEM). In these apparatuses, image observation is generally carried out by using as signals secondary electrons which reflect surface information and irregularity information on a sample.

However, during ion beam irradiation, a large quantity of secondary electrons are generated from a sample by an ion beam, and these secondary electrons overlap with secondary electrons generated by an electron beam as described in Patent Literature 1. Accordingly, during ion beam irradiation, only a SEM image with very low Signal to Noise ratio (S/N ratio) can be acquired.

Examples of a method for obtaining a SEM image during ion beam irradiation include a method in which back-scattered electrons are observed as signals which form an image. The back-scattered electrons have energy higher than that of the secondary electrons. In ion beam irradiation, high-energy electrons are hardly generated. Accordingly, if the back-scattered electrons generated by electron beam irradiation are selected and detected, it becomes possible to acquire a SEM image which is not influenced by the electrons generated by ion beam irradiation.

In the case of the FIB-SEM apparatus, there is a method in which electrons which are transmitted through a sample are observed as signals which form an image. The image (STEM image) formed with transmission electrons is not influenced by the electrons generated by ion beam irradiation. However, acquisition of the STEM image is effective only in the case of a very thin sample which transmits most incident electron beams.

Further, the FIB-SEM apparatus has a function to repeatedly perform processing of a sample by ion beam irradiation and observation of the sample with electron beam irradiation while switching between the processing and the observation.

In the field of SEMs in recent years, there has been conceived a detector (see, for example, Patent Literature 2) which selectively detects secondary electrons (to be referred to as tertiary electrons (SE3) in this specification) discharged when back-scattered electrons induced when a sample is irradiated with an electron beam collide with structures present inside a sample chamber. It is to be noted that the tertiary electrons (SE3) are hardly detected in the case where an Everhardt Thornley Detector, which is a typical secondary electron detector, is used.

CITATION LIST

Patent Literature

Patent Literature 1: JP Patent Publication (Kokai) No. 9-161712 A (1997)

Patent Literature 2: International Publication No. WO 2006/120005

Patent Literature 3: JP Patent Publication (Kokai) No. 2008-286652 A

Patent Literature 4: JP Patent Publication (Kokai) No. 2008-034172 A

Patent Literature 5: JP Patent Publication (Kokai) No. 7-296756 A (1995)

SUMMARY OF INVENTION

Technical Problem

Under such circumstances, inventors of the present invention devoted themselves to study a sample processing method with a FIB-SEM apparatus and obtained the following findings.

In recent years, in a semiconductor industry and in other various industries such as an energy industry involving fuel cells and solar batteries and an industry involving organic materials such as organic Electro-Luminescence (EL) displays, minimization of structures are progressing and improvement in a processing technology for observation samples and analysis samples is being demanded. For example, in the state-of-the-art devices, those having a node size of 30 nm or less have started to be applied. In production of thin film samples for (S)TEM for such devices, processing accuracy of a nanometer order is required. Under such a requirement, it is greatly important for the technology which significantly enhances processing reproducibility and processing efficiency to carry out SEM observation of FIB processing in real time and to monitor the processing state with sufficient accuracy on a constant basis.

However, the secondary electrons which are the most general signals in the SEM are also discharged by ion beam irradiation. Accordingly, FIB processing and SEM observation can be performed at the same time only in the case where the conditions that the current amount of an electron beam is, for example, 10 or more times larger than the current amount of an ion beam and that a SEM image is obtained in a short scanning time are satisfied. If the current amount is increased, a probe diameter of the electron beam increases, which deteriorates resolution of the SEM image. This makes it difficult to monitor FIB processing with high accuracy. A method can also be considered in which the current amount of the ion beam is decreased without increasing the current amount of the electron beam. However, this method lowers the speed of FIB processing and thereby causes considerable deterioration in processing efficiency.

In the FIB-SEM apparatus, there is an observation method in which the back-scattered electrons, which reflect material information and composition information on a sample, are used as image signals. Since the back-scattered electrons are not discharged by ion beam irradiation, selective acquisition of the back-scattered electrons makes it possible to distinguish and detect signals derived from electron beam irradiation and signals from ion beam irradiation. Accordingly, it becomes possible to perform FIB processing and SEM observation at the same time.

However, the detection efficiency of back-scattered electron detectors is lower than that of secondary electron detectors, and long scanning time is required for obtaining a high-resolution image with use of the back-scattered electron detectors. As a consequence, the processing state can be monitored by detection of the back-scattered electrons only in the case where the processing speed is very slow. This indicates that the method involving detection of the back-scattered electrons also causes considerable deterioration in processing efficiency.

Moreover, some SEMs have a Scanning Transmission Electron Microscopy (STEM) detector which detects electrons transmitted through the sample as image signals. The STEM detector is mainly composed of a Bright Field (BF) detector which detects the diffraction contrast of crystal, a Dark Field (DF) detector which detects the contrast of material composition, and a High-Angle Annular Dark-Field (HAADF) detector. The crystal structure inside the thin film sample and composition information thereof can be acquired by using the STEM detector. Like the back-scattered electron, the STEM signal is also not influenced by ion beam irradiation, so that a STEM image can be obtained during FIB processing.

However, the STEM signal can be acquired only in the case of a very thin sample through which most incident electron beams transmit. Accordingly, the condition under which the STEM signal can be used to monitor the processing state is limited to the case where the sample is very thin, and therefore the use of the STEM signal lacks versatility. Moreover, since the STEM signal includes information on the inside of the sample, it is difficult to specify the processing stop position with sufficient accuracy only with the STEM signal.

Examples of the method for monitoring the processing state also include, in addition to those described above, a method involving a function peculiar to the FIB-SEM apparatus, i.e., the function to repeat FIB processing and SEM observation while switching ion beam irradiation and electron beam irradiation.

However, it takes time to switch FIB processing and SEM observation, which also results in considerable deterioration in processing efficiency.

The present invention has been invented in view of the aforesaid circumstances, and therefore the present invention provides a technology which allows SEM observation in real time without deteriorating the processing efficiency in FIB processing.

Solution to Problem

In order to accomplish the above object, in the present invention, a composite charged-particle-beam apparatus having a FIB column and a SEM column includes an SE3 detector which detects secondary electrons (referred to as tertiary electrons in this specification) discharged when back-scattered electrons generated by irradiating a sample with an electron beam collide with structures in a sample chamber. With use of the tertiary electrons, a SEM image is generated, and based on the SEM image, the state of ion beam processing can be observed.

A control unit (integrated computer) may generate an image (SEM image) based on the tertiary electrons and may display the image on a display unit while irradiating the sample with the ion beam.

The control unit may also generate an image based on the detected tertiary electrons while controlling timing of scanning signals of the ion beam and scanning signals of the electron beam, and may control ion beam irradiation and display of the image based on the tertiary electrons according to the timing.

Moreover, when the sample is sprayed with gas while being irradiated with the ion beam to form a deposited film on the sample, the sample may be irradiated with an electron beam and a SEM image formed from the tertiary electrons may be displayed on the display unit.

Further characteristics of the present invention will become apparent from the following description of embodiments and accompanying drawing.

Advantageous Effects of Invention

According to the present invention, it becomes possible to carry out SEM observation in real time without deteriorating the processing efficiency in FIB processing.

DESCRIPTION OF EMBODIMENTS

Figure 1:
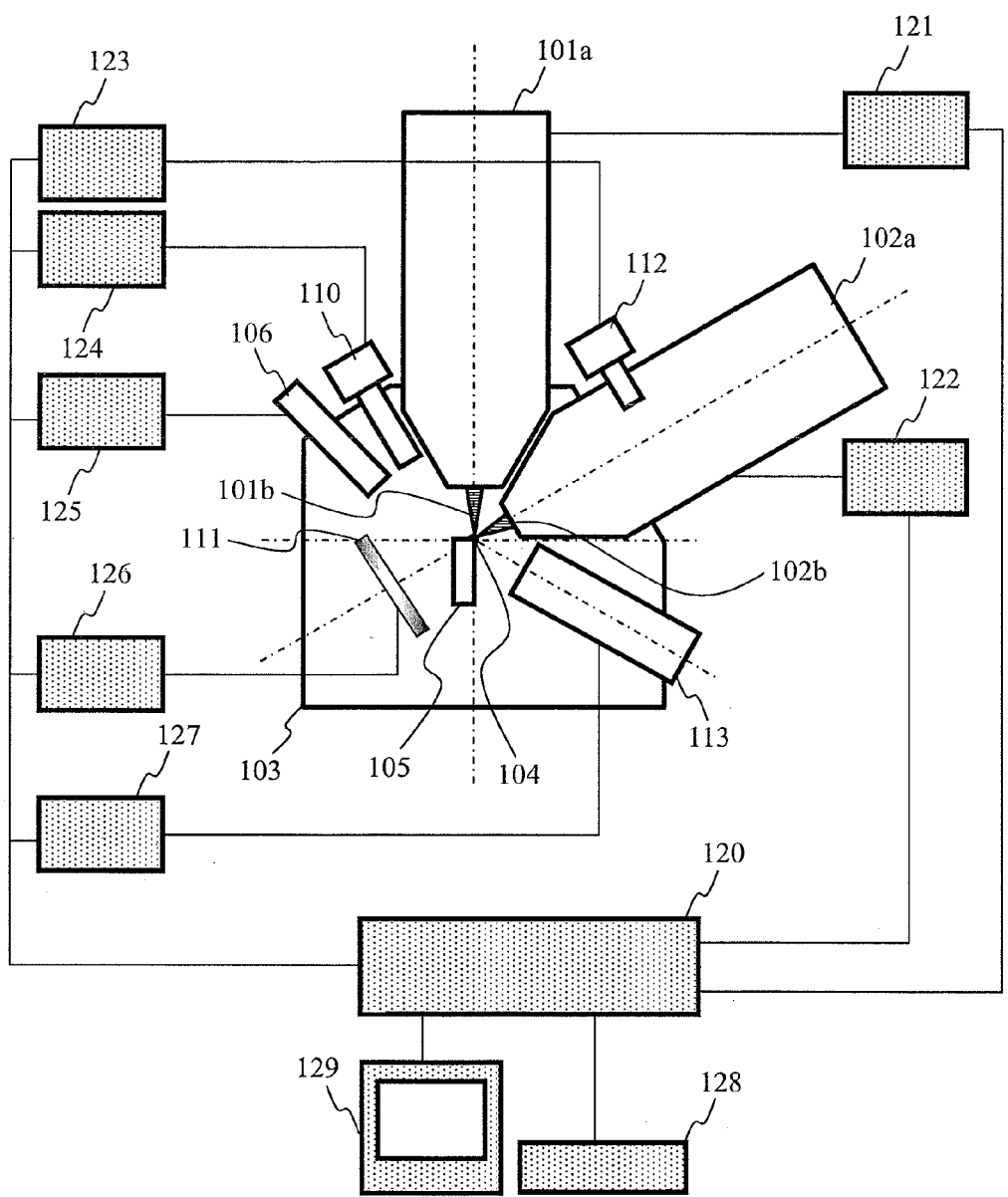
FIG. 1 is a view showing the schematic structure of a composite charged-particle-beam apparatus according to a first embodiment of the present invention.

Hereinafter, the embodiments of the present invention will be described with reference to the accompanying drawings. It should be understood that the embodiments are intended only illustrative of possible implementations of the invention and are not intended to limit the technical scope of the invention. In each of the drawings, like component members are designated by like reference numerals.

(1) First Embodiment

<Structure of Composite Charged-Particle-Beam Apparatus>

FIG. 1 is a view showing the schematic structure of a composite charged-particle-beam apparatus according to the first embodiment of the present invention. A composite charged-particle-beam apparatus 100 in FIG. 1 is shown as a FIB-SEM apparatus.

In FIG. 1, the composite charged-particle-beam apparatus 100 includes a FIB column 101a, a SEM column 102a, a sample chamber 103, and detectors provided in the sample chamber 103 including a tertiary electron detector (also referred to as a SE3 detector and including a composite charged particle detector capable of detecting not only tertiary electrons but also secondary electrons and secondary ions) 106, a secondary electron detector 110, a transmission electron detector 111, a back-scattered electron detector 112 and a low energy-loss back-scattered electron detector 113. The composite charged-particle-beam apparatus 100 also includes an integrated computer 120 for controlling operation of the entire apparatus, an ion beam scanning controller 121 for controlling scanning of an ion beam from the FIB column 101a, an electron beam scanning controller 122 for controlling scanning of an electron beam from the SEM column 102a. The composite charged-particle-beam apparatus 100 further includes a back-scattered electron detector controller 123 for providing information on the detected back-scattered electrons to the integrated computer 120, a secondary electron detector controller 124 for providing information on the detected secondary electrons to the integrated computer 120, a tertiary electron detector controller 125 for providing information on the detected tertiary electrons to the integrated computer 120, a transmission electron detector controller 126 for providing information on the detected transmission electrons to the integrated computer 120, a low energy-loss back-scattered electron detector controller 127 for providing information on the detected low energy-loss back-scattered electrons to the integrated computer 120, an operation section (such as a keyboard and a mouse) 128 for an operator to input irradiation conditions, detection conditions, various instructions and the like, and a display 129 for displaying FIB images and SEM images generated based on each detection electron.

The FIB column 101a is a system including all the components required for a FIB such as an ion source which generates an ion beam, a lens which focuses the ion beam, and a deflecting system which scans and shifts the ion beam. Similarly, the SEM column 102a is a system including all the components required for a SEM, such as an electron source which generates an electron beam, a lens which focuses the electron beam, and a deflecting system which scans and shifts the electron beam. The FIB column 101a and the SEM column 102a are mounted in the sample chamber 103. An ion beam 101b which passed the FIB column 101a and an electron beam 102b which passed the SEM column 102a intersect at one point in the sample 105 called a crosspoint 104. Although gallium ions are generally used as the ion beam 101b, any kind of ions may be used for the purpose of processing. The ion beam is not limited to a focused ion beam, but a broad ion beam may sufficiently be used.

The SE3 detector 106 (first detector) detects tertiary electrons (also referred to as SE3) which are secondary electrons generated when back-scattered electrons induced when the sample 105 is irradiated with an electron beam collide with structures inside the sample chamber 103.

The low energy-loss back-scattered electron detector 113 detects (low energy-loss) back-scattered electrons having an energy level almost equivalent to that of incident electrons.

Although the FIB column 101a is vertically placed and the SEM column 102a is placed aslant in the present embodiment, the configuration is not limited thereto. The FIB column 101a may be placed aslant, and the SEM column 102a may be vertically placed, or both the FIB column 101a and the SEM column 102a may be placed aslant. The composite charged-particle-beam apparatus 100 may have a triple column structure having a Ga focused ion beam column, an Ar focused ion beam column, and an electron beam column.

As shown in FIG. 1, in addition to the SE3 detector 106 that is the first detector as mentioned above, the detectors such as the secondary electron detector (which detects low-energy electrons of 0-50 eV) 110, the STEM detector 111, the back-scattered electron detector (which detects high-energy electrons of 50 eV or more) 112, and the low energy-loss back-scattered electron detector 113 are mounted in the sample chamber 103 as the second to fifth detectors. However, an X-ray detector and a secondary ion detector may also be mounted.

Further, in addition to the components described before, other components such as a sample stage, a gas deposition unit, a micro sampling unit are also mounted in the sample chamber 103. The sample stage for conveying the sample 105 can be used to lay the sample 105 thereon and can move horizontally and rotationally. The sample stage can also move a portion of the sample 105 needed for ion beam processing and observation to an ion beam irradiation position and can also move the portion to an electron beam observation position.

It is to be noted that the sample 105 may be a semiconductor sample, or may be steel, light metal, high molecular polymer and the like. The gas deposition unit for use in production of protective films and marking can store deposition gas which forms a deposited film by emission of a charged particle beam and can supply the deposition gas from a nozzle tip when necessary. A micro sampling unit, which is used in combination with FIB processing and cutting of the sample to pick out a specific point of the sample, includes a probe which can be moved inside the sample chamber 103 by a probe driving section (not shown). This probe is used for extracting microscopic test pieces formed on the sample and for supplying potential to the sample while being in contact with the surface of the sample.

Further, each of the FIB column 101a and the SEM column 102a has an independent control circuit as mentioned above, so that the scanning field and scanning time of each beam may be controlled independently. Each of the detectors has a control circuit and also has a circuit or arithmetic processing section for performing arithmetic processing of detection signals from respective detectors to form an image therefrom. Each of the detectors also has one or more displays for displaying acquired images. The drive mechanisms such as the sample stage, the deposition unit and the micro sampling unit also have their own control circuits. These control circuits can communicate with each other and are integrally controlled by one or more computers.

Figure 2:
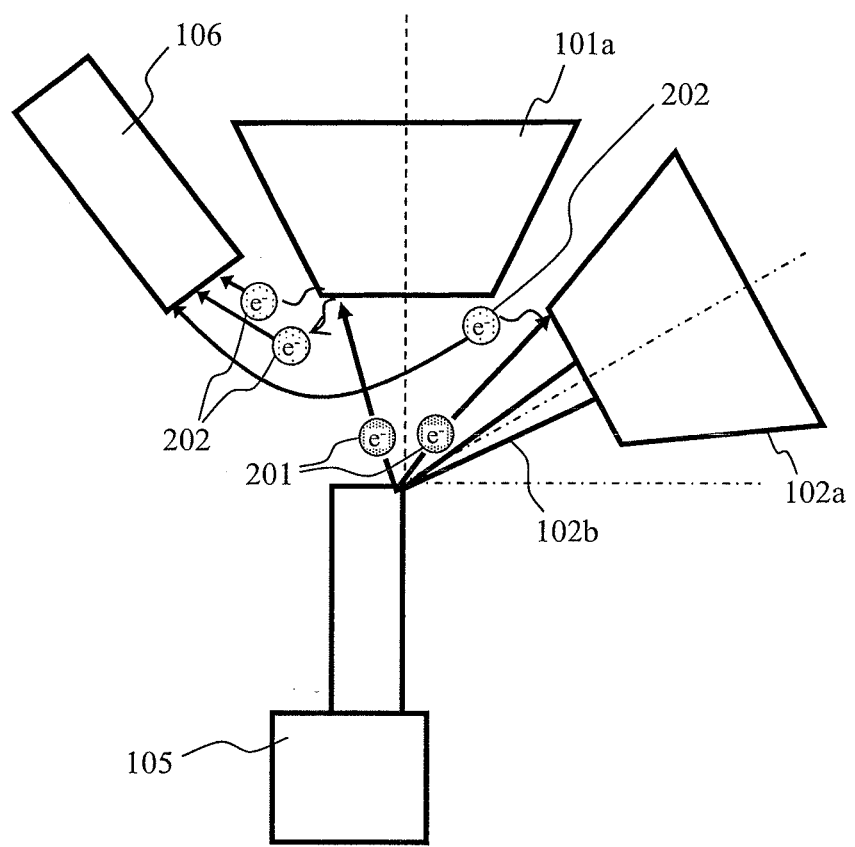
FIG. 2 is a view showing the details around a crosspoint in the composite charged-particle-beam apparatus shown in FIG. 1.

FIG. 2 is an enlarged schematic view showing an area around the crosspoint 104 shown in FIG. 1. As shown in the drawing, the SE3 are secondary electrons 202 discharged when back-scattered electrons 201 induced when the sample 105 is irradiated with the electron beam 102b collide with structures such as the FIB column 101a and the SEM column 102a present inside the sample chamber. As the SE3 detector 106, a composite charged particle detector which can detect not only SE3 but also secondary electrons and secondary ions may be used to perform selective detection.

Figure 3:
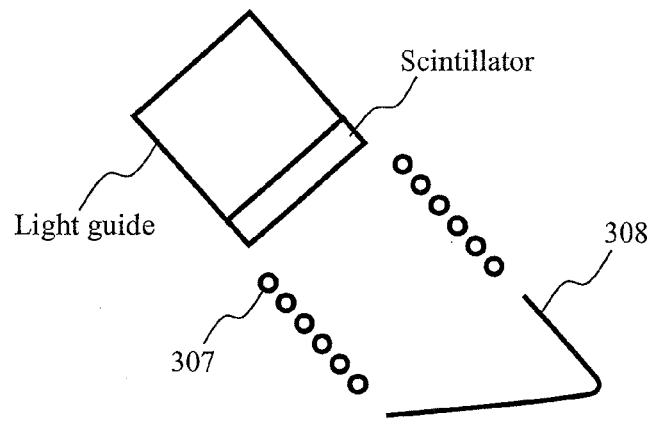
FIG. 3 is a schematic view showing the structure of a top end of an SE3 detector.

FIG. 3 is a schematic view showing an area around the top end of the SE3 detector 106 as an example of the detector which can detect SE3 and secondary electrons. As shown in FIG. 3, the SE3 detector 106 has, at the top end thereof, an SE3 collection grid (made of an electrode) 307 which adjusts (controlling) the detection efficiency of SE3 and a front grid (made of an electrode) 308 which adjusts (controlling) the detection efficiency of the secondary electrons generated from the sample 105. Consequently, different voltages can be applied to these two grids. The detection efficiency of the SE3 can be adjusted by the voltage applied to the SE3 collection grid 307, while the detection efficiency of the secondary electrons can be adjusted by the voltage applied to the front grid 308. Accordingly, it becomes possible to implement the SE detector 106 which can selectively detect SE3.

<Technical Effects of SE3 Detector>

The effects of mounting the SE3 detector 106 on the composite charged-particle-beam apparatus 100 which has the above structure and which can emit both an ion beam and an electron beam are as shown below.

The tertiary electrons (SE3) have a characteristic of not being generated by ion beam irradiation, as well as a characteristic of being considerably higher in detection efficiency than back-scattered electrons. Accordingly, the current amount of an ion beam and the current amount of an electron beam can be set independently. More specifically, mounting the SE3 detector makes it possible to fulfill the general FIB processing conditions and the general SEM observation conditions at the same time, which are difficult to achieve with the secondary electron detector generally used as a detector of the FIB-SEM apparatus.

It also becomes possible to perform SEM observation during processing with use of a high-current ion beam and to observe FIB processing at high resolution with use of a low-current electron beam. This makes it possible to implement high-accuracy FIB processing with sufficient reproducibility and efficiency. If the structures inside the sample chamber, such as the surface of an objective lens of the FIB column and the surface of an objective lens of the SEM column, are coated with a substance, such as gold and platinum, which tends to induce discharge of secondary electrons, a larger number of SE3 are discharged and an image with a higher S/N ratio can be obtained.

In the FIB-SEM apparatus, the structure information on the depth direction of the sample can be obtained by repeating the operation of cutting the sample in a cross section or on the top surface with an FIB and observing with a SEM (FIB processing and SEM observation are repeated while being switched). An image obtained by using the function (henceforth referred to as Mill & Monitor function) to repeat FIB processing and SEM observation, which is peculiar to the FIB-SEM apparatus, is constructed into a three-dimensional image at intervals between SEM-observed cross sections (or SEM-observed end surfaces) or at given set intervals. When this function is used, performing high-resolution SEM observation while conducting FIB processing with use of the SE3 detector also provides great advantage. This is, high-resolution SEM observation during FIB processing eliminates the necessity of time to switch FIB processing and SEM observation, which allows considerable reduction in time to collect image data for use in three-dimensional construction. For example, when a dynamic image is picked up during FIB processing under the conditions that a FIB processing speed is 2 nm/second, a frame rate of SEM image is 1 second, and resolution is 512× 512 pixels, three-dimensional structure information on a sample with a thickness of 1 mm can be obtained only in 10 minutes.

When it is attempted to obtain the three-dimensional structure information with use of the Mill & Monitor function, it takes about 2 hours even when an image is obtained with 10 nm processing step. This is because it takes several tens of seconds (e.g., 40 seconds) to switch FIB and SEM, and this aggregates to huge amounts of time.

Figure 4:
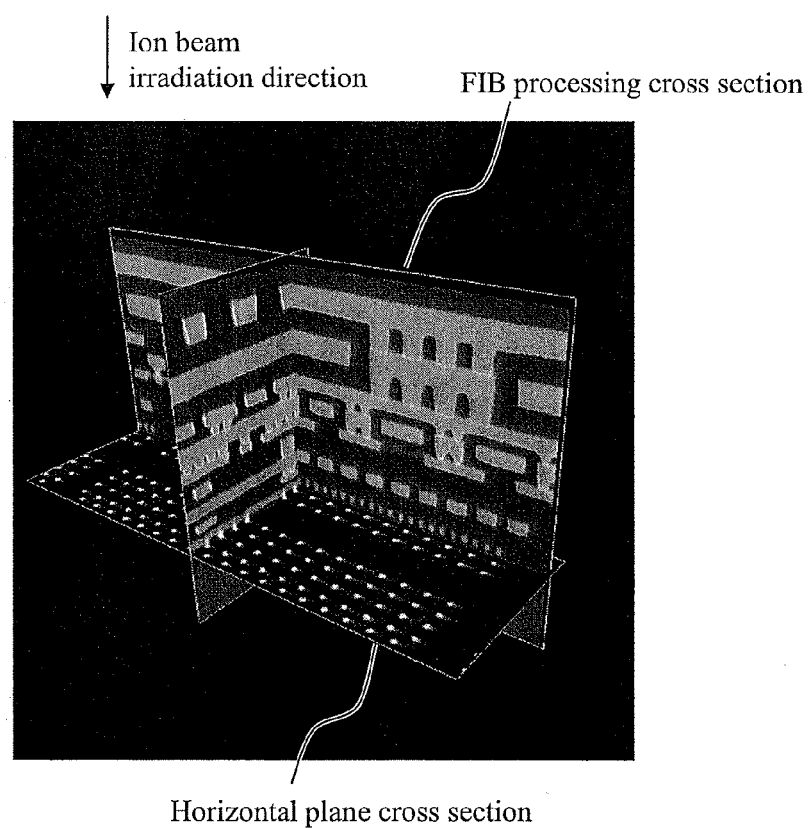
FIG. 4 is a view showing an example of three-dimensionally structured image data.

In the three-dimensionally constructed data, a cross section of the data can be sliced in a horizontal-plane direction as shown in FIG. 4. Therefore, in the case of using a sample having the same structure as that of the three-dimensionally constructed data, more precise processing position can be identified by comparing an obtained SEM image of the sample with the data. The data is also usable in specifying a processing stop position. For example, a cross sectional image at a processing stop position obtained from the acquired three-dimensional structure information is compared with a SEM image obtained during FIB processing, so that a processing stop position can automatically be detected and thereby FIB processing can automatically be terminated. It is to be noted that a function to automatically detect the processing stop position and to automatically terminate FIB processing can be implemented if the sectional structure of the processing stop position is known.

Moreover, use of the SE3 detector makes it possible to perform SEM observation while a deposited film is formed by ion beam irradiation. Accordingly, the position to form a deposited film and the amount of deposition can be monitored with sufficient accuracy. Though not shown in FIG. 1, a gas gun which sprays gas to the sample 105 for formation of the deposited film is placed in the sample chamber 103. The SE3 detector 106 detects secondary electrons (SE3) discharged when back-scattered electrons induced when the sample 105 is irradiated with an electron beam collide with structures present inside the sample chamber 103, and an image is generated based on the detected electrons. Thus, observation with use of an electron beam can be performed while a deposited film is being formed with an ion beam.

If other detection signals which allow observation during FIB processing are detected at the same time, greater diversity of information can be acquired. For example, when SEM observation is performed with use of a high-energy electron beam, electrons enter into the inside of the sample. Consequently, only with the SE3 signals, the accuracy in specifying the position of a processing cross section is deteriorated. However, when low energy-loss back-scattered electrons which reflect material information and composition information on the surface of the sample as well as SE3 are detected at the same time, it becomes possible to specify the position of a processing cross section with sufficient accuracy even in the case of using a high-energy electron beam.

In addition, when STEM signals and SE3 are obtained at the same time, structure information on the inside of the sample and thickness information on the sample are formed from the STEM signals, and structure information on the processing cross section is formed from the SE3. Accordingly, it becomes possible to specify a processing stop position while observing an image generated based on both the information. As a result, processing reproducibility and processing accuracy can be enhanced.

An image obtained by each detector can be displayed on one or more displays at the same time.

Further, the SE3 detector 106 should preferably be placed in a direction perpendicular to the FIB processing cross section. Generally, the processing cross section faces in an irradiation direction of the electron beam so that SEM observation is possible. Therefore, the SE3 detector 106 should preferably be placed on a plane perpendicular to a plane including an incident axis of the electron beam and an incident axis of the ion beam. This is because in some cases, the voltage applied to the SE3 collection grid 307 or the front grid 308 may function as attraction force or repulsive force against the ion beam. In such a case, while the processing accuracy inside an installation plane of the SE3 detector 106 considerably deteriorates, the processing accuracy in the direction perpendicular to the installation plane of the SE3 detector 106 is hardly influenced. Therefore, it is preferable to place the SE3 detector 106 in the direction perpendicular to the processing cross section where processing accuracy is demanded most.

<Simultaneous Processing of FIB Processing and SEM Observation>

A description is now given of the processing in which FIB processing and SEM observation are performed at the same time while scanning signals of a focused ion beam and scanning signals of an electron beam are synchronized.

For performing the processing, the secondary electron detector 110 shown in FIG. 1 needs to be mounted as a second detector to obtain a scanning ion microscope image. It is to be noted that a secondary ion detector may be mounted in place of the secondary electron detector 110.

In this processing, first, the irradiation position of a focused ion beam is aligned with the irradiation position of an electron beam, and both the beams scan at the same speed. When the scanning field of one beam is narrow, the beam with the narrower scanning field is made to stand by in a part of the sample or outside the sample, and only the area where the scanning fields overlap each other is scanned by both the beams at the same time. For example, when the scanning field of the ion beam is narrower than the scanning field of the electron beam, the electron beam scans as general, while the ion beam scans so that its scanning position coincides with the scanning position of the electron beam.

Figure 5:
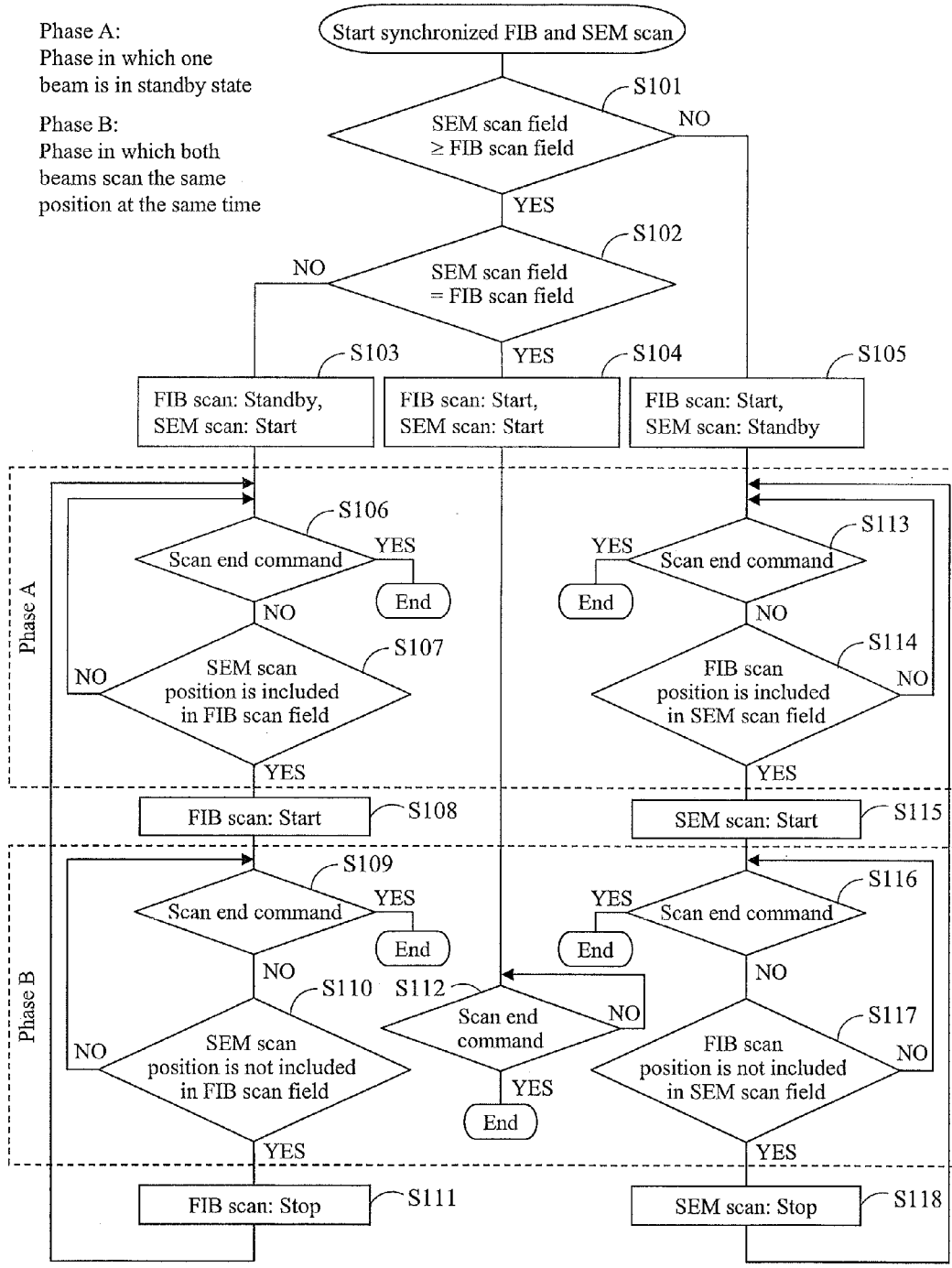
FIG. 5 is a flow chart for explaining a method for scanning a focused ion beam and an electron beam in the first embodiment.
Figure 6:
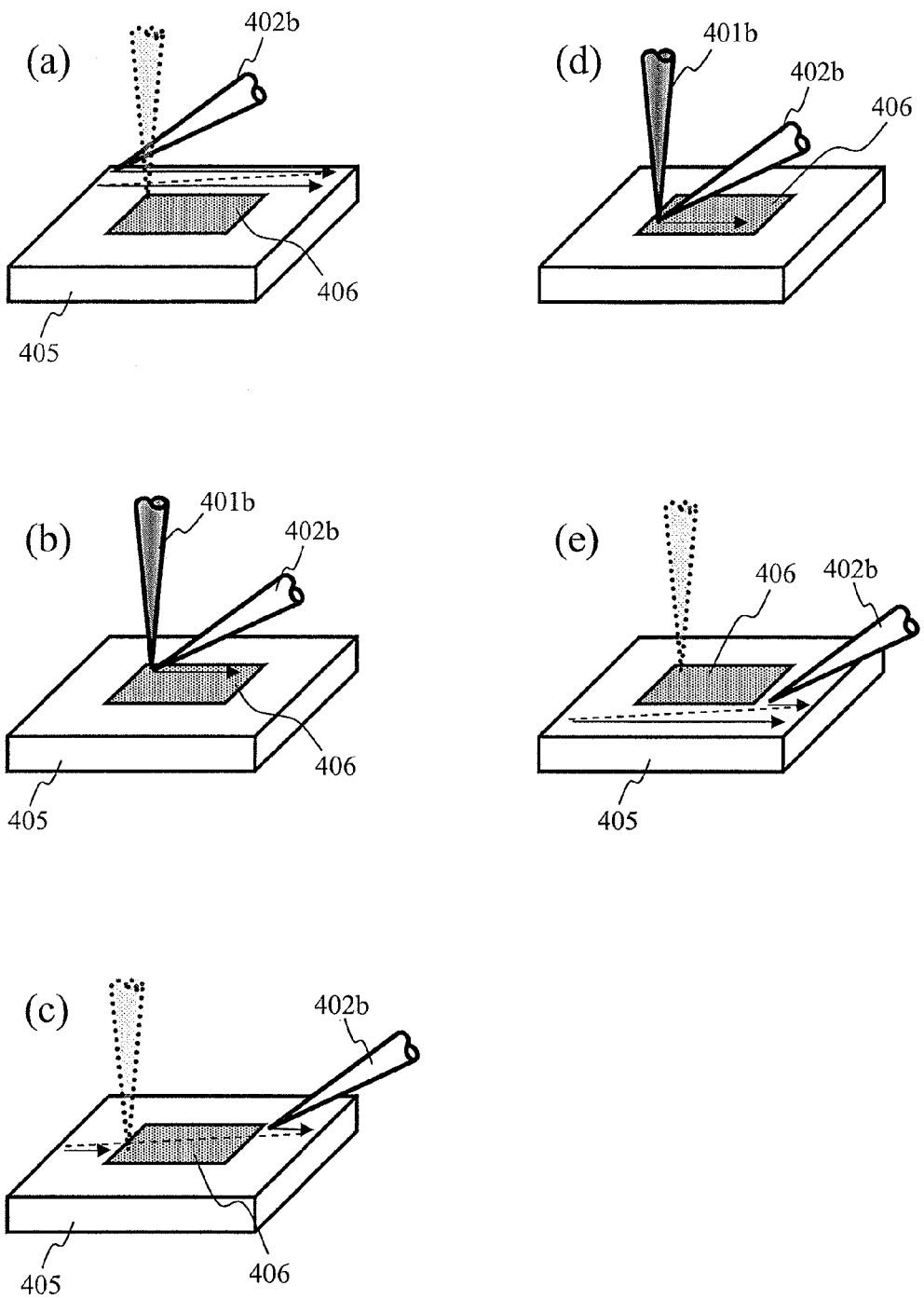
FIG. 6 is a schematic view showing the method for scanning the focused ion beam and the electron beam in the first embodiment.

FIG. 5 is a flow chart for explaining simultaneous processing of FIB processing and SEM observation. FIG. 6 is a concept view showing an example of the states in simultaneous processing of FIB processing and SEM observation.

First, in FIG. 5, the integrated computer 120 compares SEM and FIB scan fields which were inputted from, for example, the operation section 128 (Step S101). If the SEM scan field is equal to or larger than the FIB scan field, the processing shifts to Step S102, whereas if the SEM scan field is smaller than the FIB scan field, then the processing shifts to Step S105. Further, the integrated computer 120 determines whether or not the SEM scan field is identical to the FIB scan field (Step S102). If the SEM scan field is larger than the FIB scan field, the processing shifts to Step S103, whereas if they are identical, then the processing shifts to Step S104.

In Step S103, the integrated computer 120 makes FIB scan operation stand by via the ion beam scanning controller 121 and the electron beam scanning controller 122, and controls scanning of ion beam and electron beam so as to start SEM scan operation. If the integrated computer 120 receives a scan stop command, the integrated computer 120 stops the processing. If not, then the integrated computer 120 shifts the processing to Step S107 (Step S106). In Step S107, the integrated computer 120 determines whether or not a SEM scan position is included in the FIB scan field. If the SEM scan position is not included, SEM scan operation continues and the processing shifts to Step S106 again.

If the SEM scan position is included in the FIB scan field, then the integrated computer 120 starts FIB scan (Step 108). If the integrated computer 120 receives a scan stop command, the integrated computer 120 stops the processing. If not, the integrated computer 120 shifts the processing to Step S110 (Step S109). In Step S110, the integrated computer 120 determines whether or not the SEM scan position is out of the FIB scan field. If it is determined that the SEM scan position is out of the FIB scan field, then the integrated computer 120 stops FIB scan operation and shifts the processing to Step S106. If the SEM scan position is still in the FIB scan field, the integrated computer 120 shifts the processing to Step S109 so that FIB and SEM scan operations continue.

If the SEM scan field and the FIB scan field are identical in Step S102, the integrated computer 120 starts FIB scan operation and SEM scan operation (Step S104). If the integrated computer 120 receives a scan stop command, the integrated computer 120 stops the processing. If not, the integrated computer 120 continues both the scan operations (Step S112).

If it is determined that the SEM scan field was less than the FIB scan field in Step S101, the integrated computer 120 controls so that FIB scan operation starts and SEM scan operation stands by (Step S105). If the integrated computer 120 receives a scan stop command, the integrated computer 120 stops the processing. If not, then the integrated computer 120 shifts the processing to Step S114 (Step S113). In Step S114, the integrated computer 120 determines whether or not FIB scan position is included in the SEM scan field. If it is determined that the FIB scan position is not included in the SEM scan field, the integrated computer 120 continues only the FIB scan. If it is determined that the FIB scan position is included in the SEM scan field, then the integrated computer 120 shifts the processing to Step S115, and controls so that SEM scan operation starts.

Next, if the integrated computer 120 receives a scan stop command, the integrated computer 120 stops the processing. If not, then the integrated computer 120 shifts the processing to Step S117 (Step S116). In Step S117, the integrated computer 120 determines whether or not the FIB scan position is out of the SEM scan field. If it is determined that the FIB scan position is out of the SEM scan field, then the integrated computer 120 stops SEM scan operation and shifts the processing to Step S113. If the FIB scan position is still in the SEM scan field, the integrated computer 120 shifts the processing to Step S116 so that FIB and SEM scan operations continue.

In this processing, a phase in which one beam is in a standby state is defined as Phase A, and a phase in which both the beams scan the same position at the same time is defined as Phase B. Phase A includes Steps S106, S107, S113 and S114, while Phase B includes Steps S109, S110, S112, S116 and S117.

Next, the operation according to the flow chart of FIG. 5 will be explained with reference to FIG. 6 for more easy understanding. As shown in FIG. 6(a), at first, only an electron beam 402b scans the surface of a sample 405. At this time, an ion beam is made to stand by at a position outside the sample, and the sample is not irradiated therewith. This state represents the state of Phase A in FIG. 5. When the scanning position of the electron beam 402b reaches an area overlapping with an ion beam scan field 406, an ion beam 401b is emitted to the sample 405 to scan at the same speed as the electron beam as shown in FIG. 6(b). This state represents the state of Phase B in FIG. 5. When the scanning position of the electron beam 402b reaches a position out of the ion beam scanning field 406, the ion beam is made to stand by at a position outside the sample, and only the electron beam 402b scans as shown in FIG. 6(c). This state represents the state after the processing returned to Phase A in FIG. 5. When the electron beam 402b reaches again the area overlapping with the ion beam scanning field 406, the ion beam 401b is emitted to the sample 405 to scan at the same speed as the electron beam as shown in FIG. 6(d). This state represents the state after the processing shifted again to Phase B in FIG. 5. When both the beams reach a terminal point of the ion beam scanning field 406 after repeating the processings of FIGS. 6(b), (c) and (d) several times, the ion beam is made to stand by at a position outside the sample and only the electron beam 402b scans as shown in FIG. 6(e). This state represents the state of Phase A in FIG. 5 again. Thus, a SEM image and a scanning ion microscope image are obtained at the same time while the processes shown in FIGS. 6(a) through 6(e) are repeated.

Further, these two kinds of obtained images can be displayed at the same time on a display 129 included in the FIB-SEM apparatus. Here, one side or both the sides of the obtained scanning ion microscope image (FIB image) may be magnified or reduced to an arbitrary size, so that the FIB image is displayed together with a scanning electron microscope image (SEM image) at the same time.

The following effects can be obtained by executing the above processings. First, when the ion beam scanning field is narrower than the electron beam scanning field, a SEM image can be used to observe the position of a processing area, and an image of the ion beam scanning area can be used to monitor the position of a processing cross section. As a result, displacement in the processing position can immediately be detected, and the processing position can be corrected automatically or manually. This makes it possible to enhance processing accuracy.

When the ion beam scanning field is wider than the electron beam scanning field, an image of the ion beam scanning area can be used to check the state of the entire processing cross section while the SEM image can be used to minutely observe the sectional structure of a local area. Accordingly, the processing stop position can be specified with high accuracy. A high-resolution image of an area having periodic structures, such as periodic structures present in a processing proceeding direction as seen in semiconductor devices, can be observed while a wide processing area can be maintained. As a result, a (S)TEM thin film sample with a large observation field and high quality can be produced.

When the scan speed of an ion beam is faster than the scan speed of an electron beam, the position of the processing cross section in one SEM image sheet is displaced by a processing amount equivalent to a difference in emission time between the ion beam and the electron beam. However, the displacement can be eliminated by setting the scan speed of the electron beam identical to the scan speed of the ion beam under the control of the integrated computer 120. This makes it possible to enhance the accuracy in specifying the processing stop position. Also in the case where SEM images are obtained during FIB processing to construct three-dimensional structure data on the sample, it becomes possible to enhance the accuracy in constructing the three-dimensional structure.

Further, a SEM image of the sample immediately after cutting processing can be obtained by setting the scan time of the electron beam slightly later than the scan time of the ion beam (so that both the beams scan at the same time (in synchronization) but they scan the same position at different time) according to the operator's instructions. This technique is particularly effective in the case of observing materials with an unstable surface such as substances having rapid oxidation reaction. In this case, however, an image obtained with use of the secondary electron detector has the structure information at the electron beam irradiation position mixed with the structure information at the ion beam irradiation position.

Since the structure information acquired by electron beam irradiation may be different from the structure information acquired by ion beam irradiation, synchronizing the ion beam scanning with the electron beam scanning provides major advantage not only in the case where the ion beam is used for processing but also in the case where the ion beam is used for observation.

In the present embodiment, the SE3 detector 106 is used for acquiring SEM images. However, any kind of detectors such as the back-scattered electron detector 112 and the low energy-loss back-scattered electron detector 113 may be used as long as the detectors can acquire SEM images without being influenced by ion beam irradiation.

<Change in Ion Beam Processing Area and Processing Conditions>

Figure 7:
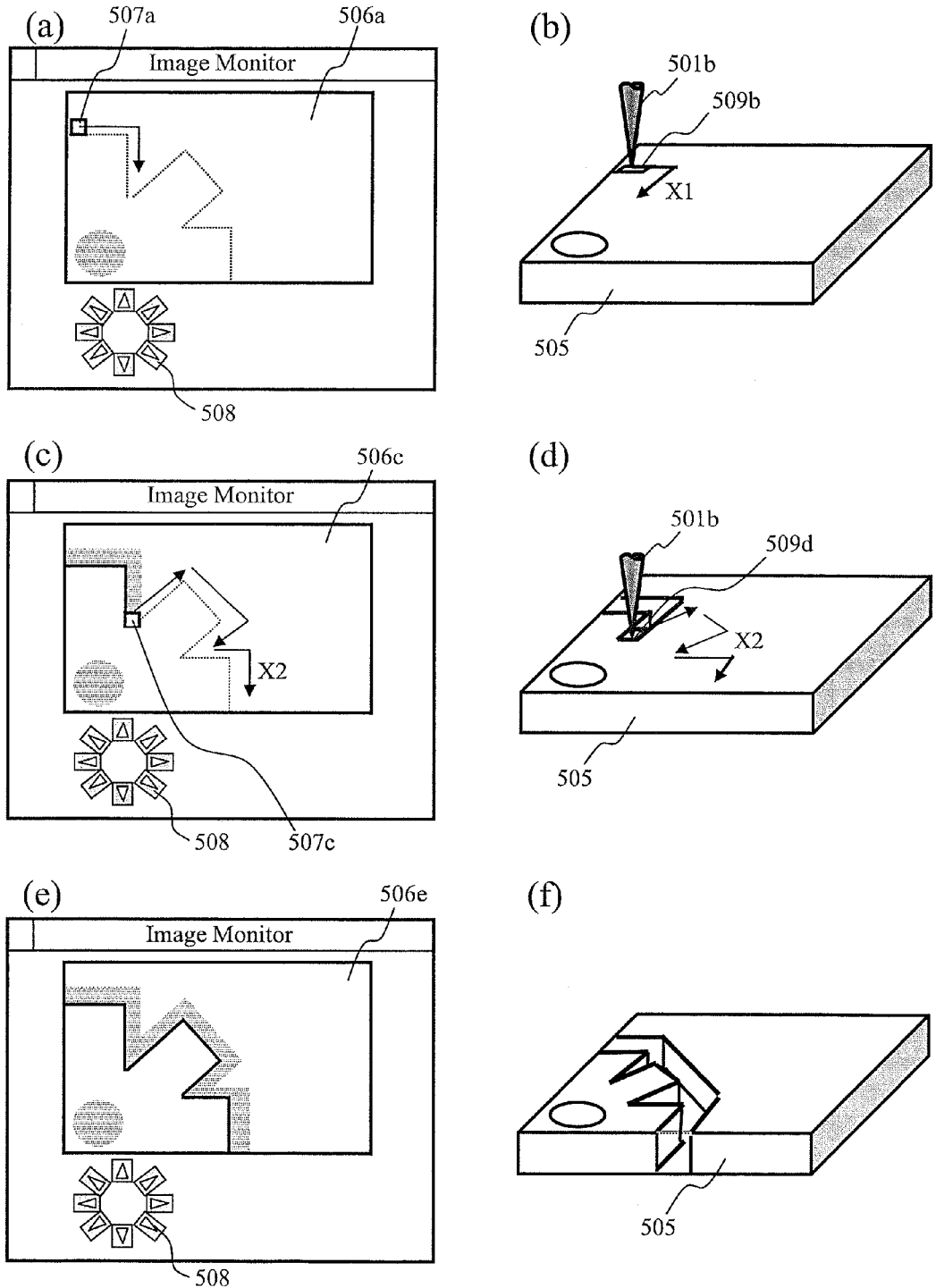
FIG. 7 is a view for explaining a function to change FIB processing conditions while observing a SEM image.

A description is now given of the operation for changing the ion beam processing area and processing conditions (ion beam irradiation conditions) while continuing ion beam (FIB) processing. FIG. 7 is a view showing the outline of this operation.

FIGS. 7(a), (c) and (e) show the display screens of a display when the present embodiment is implemented. FIGS. 7(b), (d) and (f) show the shapes of a sample corresponding to the screens shown in FIGS. 7(a), (c) and (e), respectively.

It is assumed that processing is started in the state shown in FIG. 7(b). The shape shown with a dotted line in a SEM image display screen 506a represents a shape to be achieved by processing. First, a sample 505 is observed with a SEM, and the obtained SEM image is displayed on the SEM image display screen 506a. Next, an ion beam scanning field 509b is set with reference to the SEM image display screen 506a. An indicator 507a for indicating the ion beam scanning field is displayed on the SEM image display screen.

Next, the ion beam scanning field 509b is moved in a direction of arrow X1 shown in FIG. 7(b) with use of a control button 508. In this case, the SEM image on the SEM image display screen 506a is continually updated. The indicator 507a for indicating the ion beam scanning field is also moved in response to the movement of the ion beam scanning field 509b. Then, the ion beam 501b reaches an ion beam scanning field 509d shown in FIG. 7(d). At this time, a SEM image as shown in FIG. 7(c) is displayed on the SEM image display screen. The sample is given the shape as shown in FIG. 7(d). In the foregoing manner, processing with the ion beam is continued. That is, the ion beam scanning field 509d is moved in the direction of arrow X2 shown in FIG. 7(d) with use of the control button 508. An indicator 507c for indicating the ion beam scanning field on the SEM image display screen 506c is also moved in the direction of arrow X2 shown in FIG. 7(c) in response to the movement of the ion beam scanning field 509d. As a result, a desired shape can be produced as shown in FIG. 7(f).

The following effects can be obtained by implementing the aforementioned function. Generally, in ion beam processing, processing conditions are selected, then processing time is set, and after processing is finished, a processed shape is confirmed. Accordingly, in the case of conducting micro processing, it is necessary to estimate processing conditions in advance. However, when this function is used, the shape of the sample during processing is observed with use of the SEM. Consequently, the processing shape can constantly be fed back and the processing area and processing conditions can be set accordingly. This eliminates the necessity of estimating the processing conditions in advance.

When it is desired to cut out only a portion of the sample, it can be achieved simply by moving the scanning area of the ion beam along the shape to be cut out while observing the SEM image. Therefore, processing can be conducted easily.

When it is desired to process a sample made of various substances into an arbitrary shape, setting of the processing conditions is generally complicated as processing speed varies for substances. However, if this function is used, the processing area is changed while the processing state is observed. Consequently, it is not necessary to perform such a complicated setting in advance.

Moreover, prompt action can be taken against unexpected situations such as sample drift, and processing can be continuously carried out.

In the present embodiment, the control button (GUI) 508 displayed on the display 129 was used to move the ion beam scanning field. However, a control panel (console panel) and a mouse for exclusive use may be used for the purpose of moving the ion beam scanning field. Also in the present embodiment, the ion beam scanning field was moved with the control button 508, and the indicator in the SEM image was moved in response to the movement. However, if the indicator in the SEM image is moved with a mouse and the like, the ion beam scanning field is moved in response to the movement. Further, although the ion beam scanning field was moved in a parallel direction, it may be moved rotationally. In that case, it is necessary to form the control button 508 to have a rotationally movable shape.

(2) Second Embodiment

The structure of a composite charged-particle-beam apparatus according to a second embodiment is generally identical to the structure of the apparatus in the first embodiment except for the structure inside the FIB column.

Figure 8:
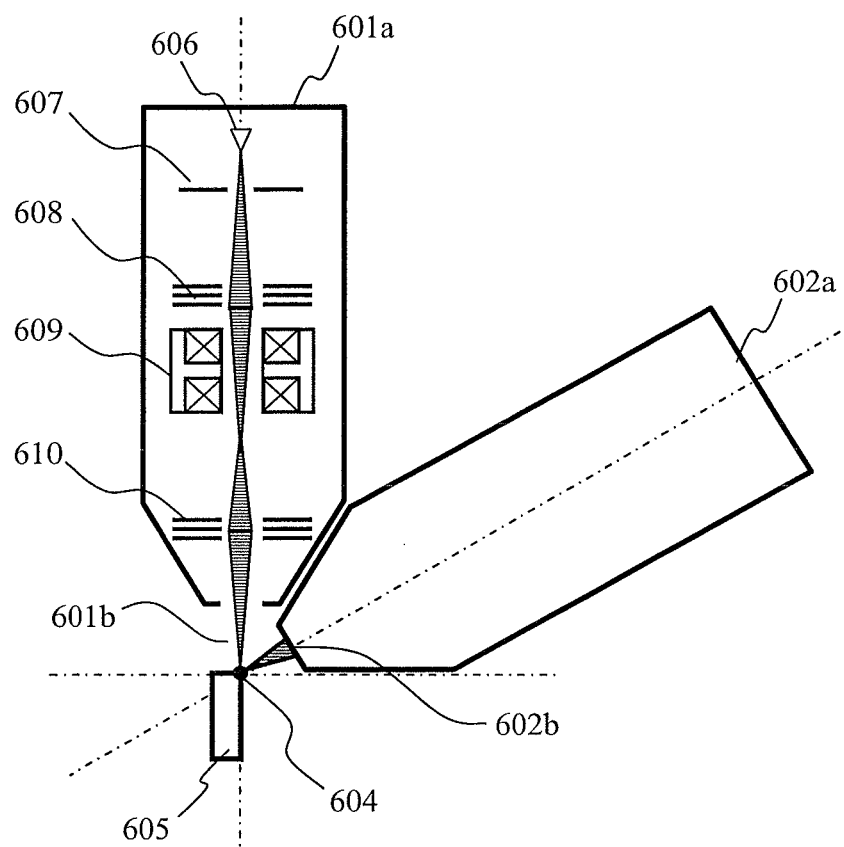
FIG. 8 is a view showing the schematic structure of a composite charged-particle-beam apparatus having a correction magnetic field generation section according to a second embodiment of the present invention.

More specifically, as shown in FIG. 8, a FIB column 601a is structured to have a correction magnetic field generation section 609, which is generally not provided in the FIB column, interposed in between an electrostatic condenser lens 608 and an electrostatic objective lens 610. Other component elements of the FIB column 601a are identical to those of the first embodiment.

The correction magnetic field generation section 609 corrects distortion of an ion beam. The following technical effects are obtained by providing the correction magnetic field generation section 609.

When a magnetic field exists on the optical axis of an ion beam, ions different in mass take different orbits as described in Patent Literature 4. This causes a problem that an ion beam does not focus on one point on the surface of a sample 605. A gallium ion beam which is generally used includes two kinds of isotopes. Even with the FIB-SEM apparatus incorporating the SE3 detector 106, FIB processing and SEM observation cannot be conducted at the same time if the SEM in the apparatus uses a type of the objective lens which leaks a magnetic field to the sample 105 side.

However, even in the case where a magnetic field exists on the optical axis of the ion beam 601b, providing the correction magnetic field generation section 609 enables an ion beam to focus on a crosspoint 604 without causing isotope separation on the sample. Accordingly, even with the SEM using a type of the objective lens which leaks a magnetic field to the sample 105 side, SEM observation can be performed during FIB processing.

A type of the lens called a semi-in-lens or a snorkel, which leaks a magnetic field to the sample side, has a beam probe diameter smaller than that of an out-lens objective lens which does not leak a magnetic field to the sample side. With such an objective lens, observation can be implemented with higher resolution. Therefore, it becomes possible to enhance processing accuracy by performing high-resolution SEM observation with use of the semi-in-lens objective lens during FIB processing. When three-dimensional construction is performed with use of a plurality of SEM image sheets obtained, three-dimensional construction with higher resolution becomes possible.

Although the correction magnetic field generation section 609 is interposed in between the electrostatic condenser lens 608 and the electrostatic objective lens 610 in the present embodiment, the same effects can be obtained wherever in the FIB column 601a the correction magnetic field generation section 609 is placed. Moreover, a mechanism which removes unnecessary isotope components and obtains only the desired ions (e.g., a filter which removes isotopes unnecessary for processing of the sample 105 from the ion beam including a plurality of isotopes and generates an ion beam made of single mass ions) as disclosed in Patent Literature 5 may also be provided, so that SEM observation can be performed in a semi-in-lens mode during ion beam irradiation, although an ion beam irradiation current is decreased.

INDUSTRIAL APPLICABILITY

An apparatus can be provided which can carry out SEM observation of FIB processing in a FIB-SEM apparatus in real time and to monitor the processing state with sufficient accuracy on a constant basis. High-definition and high-accuracy thin film samples can be produced for the state-of-the-art devices and functional materials, so that processing reproducibility and processing efficiency, as well as the analysis accuracy in (S)TEMs are dramatically enhanced.

Also in the composite charged-particle-beam apparatus having a column which emits an ion beam for the purpose of observation such as He ion microscopes and a column which emits an electron beam, a scanning ion microscope image and an electron microscope image can be obtained at the same time.

REFERENCE SIGNS LIST

101a, 601a: Ion beam column
101b, 401b, 501b, 601b: Ion beam
102a, 602a: Electron beam column
102b, 402b, 602b: Electron beam
103: Sample chamber
104, 604: Crosspoint
105, 405, 505, 605: Sample
106: Tertiary electron detector (including a composite charged particle detector capable of detecting not only tertiary electrons but also secondary electrons and secondary ions)
110: Secondary electron detector
111: Transmission electron detector
112: Back-scattered electron detector
113: Low energy-loss back-scattered electron detector
120: Integrated computer
121: Ion beam scanning controller
122: Electron beam scanning controller
123: Back-scattered electron detector controller
124: Secondary electron detector controller
125: Tertiary electron detector controller
126: Transmission electron detector controller
127: Low energy-loss back-scattered electron detector controller
128: Controller (keyboard, mouse, etc.)
129: Display
201: Back-scattered electron
202: Secondary electron discharged by collision with structures present inside sample chamber
307: SE3 collection grid
308: Front grid
406: Ion beam scanning field
506a, 506c, 506e: SEM image display screen
507a, 507c: Indicator for indicating ion beam scanning field
508: Control button which moves ion beam scanning field
509b, 509d: Ion beam scanning field
606: Ion source
607: Accelerating electrode
608: Electrostatic condenser lens
609: Correction magnetic field generation section
610: Electrostatic objective lens

The invention claimed is:
1. A composite charged-particle-beam apparatus comprising:
an ion beam column which emits an ion beam;
an electron beam column which emits an electron beam;
a sample chamber having the ion beam column and the electron beam column attached thereto;
a tertiary electron detector which detects tertiary electrons which are secondary electrons generated when back-scattered electrons induced when a sample is irradiated with the electron beam collide with structures present inside the sample chamber; and a control unit which generates an image based on the detected tertiary electrons while controlling timing of scanning signals of the focused ion beam and scanning signals of the electron beam, and executes emission of the ion beam and display of the image on a display unit based on the tertiary electrons according to the timing, wherein the control unit synchronizes the scanning signals of the ion beam with the scanning signals of the electron beam, and aligns scan positions of both the beams at an identical time if a scanning area of the ion beam is identical to a scanning area of the electron beam.

2. The composite charged-particle-beam apparatus according to claim 1, further comprising an ion image detector which irradiates the sample with the ion beam and detects secondary electrons or secondary ions from the sample, wherein the control unit obtains an image based on the secondary electrons or the secondary ions detected by the ion image detector, and displays the image based on the secondary electrons or the secondary ions and the image based on the tertiary electrons on the display unit at the same time.

3. The composite charged-particle-beam apparatus according to claim 1, further comprising a gas gun which sprays gas to a sample;

wherein the control unit generates an image based on the detected tertiary electrons and displays the image based on the tertiary electrons on a display unit at a time of forming the deposited film with use of the ion beam.

4. A composite charged-particle-beam apparatus, comprising:

an ion beam column which emits an ion beam;
an electron beam column which emits an electron beam;
a sample chamber having the ion beam column and the electron beam attached thereto;

a tertiary electron detector which detects tertiary electrons which are secondary electrons generated when back-scattered electrons induced when a sample is irradiated with the electron beam collide with structures present inside the sample chamber; and a control unit which generates an image based on the detected tertiary electrons while controlling timing of scanning signals of the focused ion beam and scanning signals of the electron beam, and executes emission of the ion beam and display of the image on a display unit based on the tertiary electrons according to the timing, wherein the control unit synchronizes the scanning signals of the ion beam with the scanning signals of the electron beam, and if a scanning area of the ion beam is different from a scanning area of the electron beam, the control unit makes a scanning operation of one of the beams stand by so that scanning time of both the beams coincides at a portion where the scanning areas overlap.

5. The composite charged-particle-beam apparatus according to claim 4, further comprising:

an ion image detector which irradiates the sample with the ion beam and detects secondary electrons or secondary ions from the sample, wherein the control unit obtains an image based on the secondary electrons or the secondary ions detected by the ion image detector, and displays the image based on the secondary electrons or the secondary ions and the image based on the tertiary electrons on the display unit at the same time.

6. The composite charged-particle-beam apparatus according to claim 4, further comprising:

a gas gun which sprays gas to a sample,
wherein the control unit generates an image based on the detected tertiary electrons and displays the image based on the tertiary electrons on a display unit at a time of forming the deposited film with use of the ion beam.

* * * * *